United States Patent
Kose et al.

(10) Patent No.: US 9,055,704 B2
(45) Date of Patent: Jun. 9, 2015

(54) HOT PRESS DEVICE AND MULTI-LAYERED PRINTED BOARD PRESS METHOD

(75) Inventors: Kouji Kose, Yamakita (JP); Kouta Togawa, Hadano (JP); Katsuro Kawazoe, Hadano (JP); Takayoshi Kojima, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/329,589

(22) Filed: Dec. 19, 2011

(65) Prior Publication Data

US 2012/0152457 A1   Jun. 21, 2012

(30) Foreign Application Priority Data

Dec. 20, 2010 (JP) .................................. 2010-282698

(51) Int. Cl.
  *B30B 7/02* (2006.01)
  *H05K 3/46* (2006.01)
(52) U.S. Cl.
  CPC .................................. *H05K 3/4638* (2013.01)
(58) Field of Classification Search
  CPC .... H01L 21/67092; B30B 7/02; B30B 15/06; B30B 15/041; B30B 15/34; B30B 7/023; B30B 7/026; B29C 65/00; H05K 2203/068
  USPC .............. 156/580, 583.1–583.4; 29/829–853, 29/729, 736; 100/194, 199, 200
  See application file for complete search history.

(56) References Cited

U.S. PATENT DOCUMENTS

| | | | | |
|---|---|---|---|---|
| 4,392,909 A | * | 7/1983 | Bohn et al. | 156/306.9 |
| 4,875,966 A | * | 10/1989 | Perko | 156/580 |
| 4,908,087 A | * | 3/1990 | Murooka et al. | 156/286 |
| 5,228,946 A | * | 7/1993 | Draudt | 156/580 |
| 2002/0088555 A1 | | 7/2002 | Urano | |

FOREIGN PATENT DOCUMENTS

| | | | | |
|---|---|---|---|---|
| JP | 04326596 A | * | 11/1992 | H05K 3/46 |
| JP | 05-228955 A | | 9/1993 | |
| JP | 06-54485 U | | 7/1994 | |
| JP | 2002-200630 A | | 7/2002 | |

\* cited by examiner

*Primary Examiner* — Scott W Dodds
(74) *Attorney, Agent, or Firm* — Volpe and Koenig, P.C.

(57) ABSTRACT

A hot press device manufacturing a multilayered printed board by pressing processed members laminated by mutually opposing heating plates includes: a plurality of heating plates including a plurality of projected parts and punched parts engaging therewith and capable of moving in a direction in which the processed members are laminated; and a pressure mechanism pressurizing each of the heating plates in the lamination direction, wherein the processed member is arranged between the heating plates and is pressed by the heating plates pressurized by the pressure mechanism while engaged with each other.

4 Claims, 10 Drawing Sheets

HOT PRESS DEVICE AND MULTI-LAYERED PRINTED BOARD PRESS METHOD

CLAIM OF PRIORITY

The present application claims priority from Japanese application serial no. JP2010-282698, filed on Dec. 20, 2010, the content of which is hereby incorporated by reference into this application.

BACKGROUND OF THE INVENTION

1. Technical Field of the Invention

The present invention relates to a hot press device and a multi-layered printed board press method.

2. Description of Related Arts

Generally, a multilayered printed board has high density of connection pads arranged for transmitting and receiving a signal between an external device and wires electrically connecting together components mounted on a front surface and for receiving power. In processes of manufacturing the multilayered printed board, designing is done while providing layers for dimensionally wiring and connecting together the connection pads described above with efficiency, and based on designed information, a pattern (inner layer pattern) of each layer is created. Integrating the layers is called a laminate bonding process.

In the laminate bonding process, the layers are electrically insulated, and also while a laminated body formed by alternately laminating insulation layers (generally called prepreg formed by soaking thermally plastic resin in a core material) for physical coupling is heated by upper and lower stream plates, it is pressurized for a fixed time period to be cured. Then punching processing for connecting together wires between the layers is carried out, and the entire board including a portion exposing an inner layer conductor is subjected to plating. Then a topmost surface pattern is formed by a photo resist method and an insulating material is coated between pads when necessary for completion.

In recent years, following downsizing of components mounted on the multilayered printed board, an interval between the connection pads is packaged with higher density year by year. Therefore, in order to ensure reliability of interlayer connection of the layers described above, it is required to eliminate dislocation of the upper and lower layers at time of the laminate bonding. As a method of eliminating such dislocation, various techniques have been disclosed conventionally.

For example, Unexamined Utility Model Patent No. H6-54485 discloses the technique of fixing a stationary guide plate 13 formed with a guide surface 13A to a frame 11 located at position corresponding to four corners of a middle heating plate 4, fixing a holding metal fitting 40 to the four corners of the middle heating plate 4 corresponding to the stationary guide plate 13, and abutting an abutting surface 42 formed at the holding metal fitting 40 against the guide surface 13A to thereby avoid dislocation of a heating plate even as a result of expansion and contraction of the heating plate.

Moreover, Japanese Patent Application Laid-open No. Hei 5-228955 discloses the technique of in a laminating press device configured to sandwich, between heating plates, 3 a laminate material formed by laminating a copper foil and prepreg and a stainless plate and perform hot forming by a hydraulic ram 2 while applying pressure in a chamber 7 with reduced pressure enclosed by a partition wall 6, disposing, outside of a forming range composed of heating plates 3, mechanical detection units 12 composed of a detection bar 9 whose upper end is firmly fixed to a ceiling part of the chamber 7 and which hangs in a manner such as to be capable of oscillating, a limit switch 10 mechanically detecting horizontal displacement of the detection bar 9, and a guide 11 regulating a direction of the displacement of the detection bar 9 respectively adjacently to four sides of the heating plate 3 to thereby reliably detect dislocation of, for example, the stainless plate in the laminate press device automatically and also without causing erroneous operation.

Moreover, Japanese Patent Application Laid-open No. 2002-200630 discloses the technique of, in a press device configured to pull up a movable platen 15 by a pull-up device 20 above an upper platen 16 and perform pressing processing on each processed material L between press plates 17, providing, perpendicularly and upright near positions of four corners of the movable platen, a guide bar 30 having a guide surface 31 extending on a surface where the movable platen does not turn with respect to a planar center of the movable platen of a cross line crossing the planar center of the movable platen from near the position of the four corners and also in a direction of the cross line and also providing a sliding guide part 35 sliding while firmly attached to the guide surface of the guide bar to thereby pull up the movable platen (and a press plate) in the laminate press device in parallel with good balance and also resolve problems occurring at the different parts upon the pull-up.

SUMMARY OF THE INVENTION

However, even with the techniques described above, since the guide for preventing horizontal movement of the heating plate to a member such as a frame formed on a device side is provided, a gap is provided between the heating plate and the guide, thus causing dislocation in the heating plates between the layers in a direction different from a press direction, for example, horizontal movement of the heating plate itself, which consequently cause a problem of dislocation of the different layers forming the laminated body.

The present invention has been made in view of the problem described above, and it is an object of the invention to provide a hot press device and a multilayered printed board press method avoiding dislocation of layers forming a laminated body.

To address the problem described above, a hot press device according to one aspect of the invention manufactures a multilayered printed board by pressing processed members laminated by mutually opposing heating plates, and includes: a plurality of heating plates including a plurality of projected parts and punched parts engaging therewith and capable of moving in a direction in which the processed members are laminated; and a pressure mechanism pressurizing each of the heating plates in the lamination direction, wherein the processed member is arranged between the heating plates and is pressed by the heating plates pressurized by the pressure mechanism while engaged with each other.

Another aspect of the invention refers to a multilayered printed board press method performed in a hot press device manufacturing a multilayered printed board by pressing processed members laminated by mutually opposing heating plates.

The present invention can provide a hot press device and a multilayered printed board press method avoiding dislocation of layers forming a laminated body.

DETAILED DESCRIPTION OF THE DRAWINGS

DETAILED DESCRIPTION OF THE PREFERRED EMBODIMENT

Hereinafter, an embodiment of a hot press device and a multilayered printed board press method according to the present invention will be described in detail with reference to the accompanying drawings.

Figure 1:
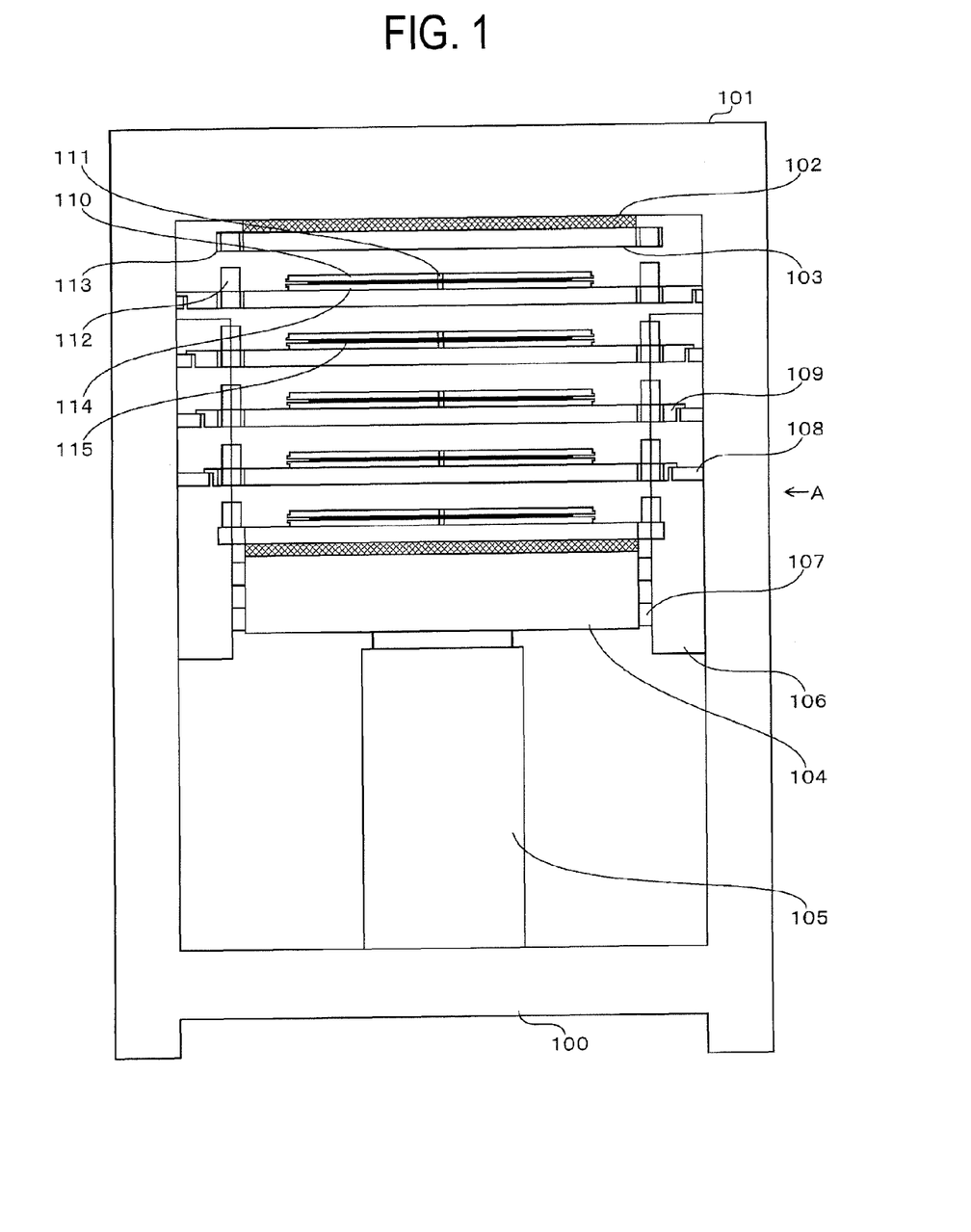
FIG. 1 is a diagram showing configuration of a hot press device according to an embodiment of the present invention.
Figure 2:
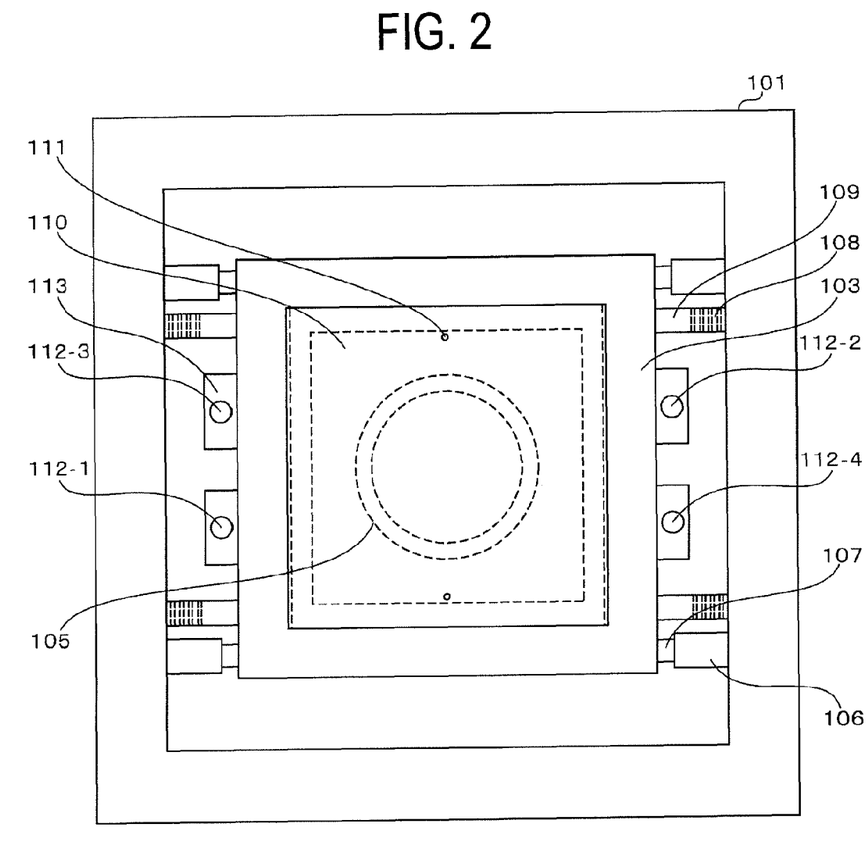
FIG. 2 is a top view of the hot press device shown in FIG. 1.
Figure 3:
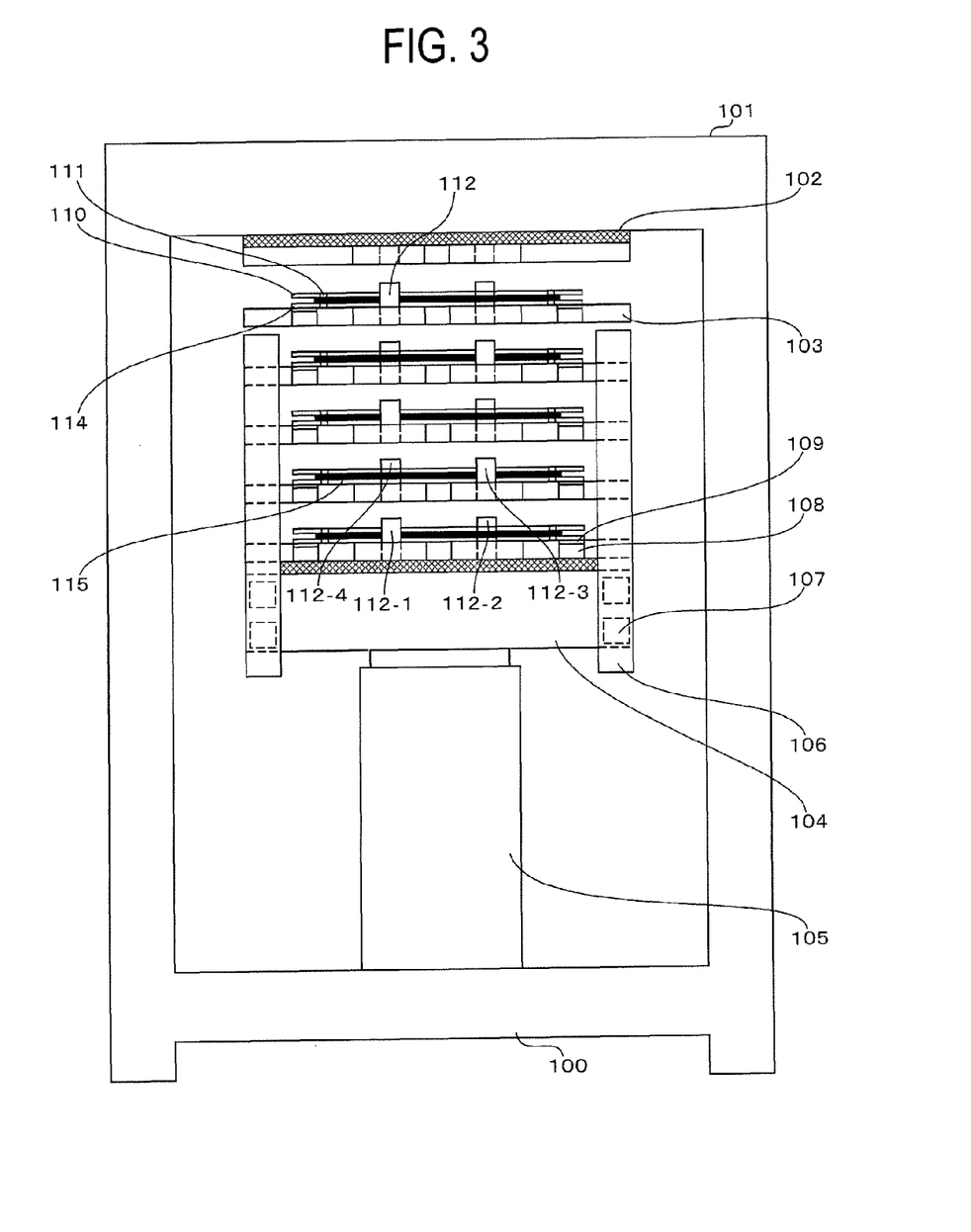
FIG. 3 is a side view of the hot press device shown in FIG. 1.

FIG. 1 is an example of a configuration diagram of a hot press device 100 according to this embodiment, showing a front view of the device. FIG. 2 is an example of the configuration diagram of the hot press device 100 shown in FIG. 1, showing a top view from the top. FIG. 3 is an example of the configuration diagram of the hot press device 100 shown in FIG. 1, showing a side view from a side of the device (direction A shown in FIG. 1).

As shown in FIGS. 1 to 3, the hot press device 100 is structured to move up a surface plate 104 by a pressure cylinder 105 placed at a frame 101 and sequentially press up heating plates 103, work handling lower jigs 114, work handling upper jigs 110, and a work 115 from the bottom. In this embodiment, as described later, each of the heating plates 103 itself is provided with heating plate guide pins 112 and heating plate guide bushes 113 so that the heating plates 103 engage with each other without horizontal dislocation. Therefore, in the examples shown in FIGS. 1 to 3, the number of heating plates 103 is six forming five steps, but as long as the number of heating plates 103 is at least three forming two steps, the number of heating plates 103 and the number of steps are not limited.

Moreover, as shown in FIGS. 2 and 3, a total of two heating plate guide pins 112 are provided (one (for example, heating plate guide pin 112-1) at one side of one heating plate 103 and the other one (for example, heating plate guide pin 112-2) at a side opposing the aforementioned side diagonally to the aforementioned heating plate guide pin 112-1). Then the heating plates 103 above and below the aforementioned heating plate 103 are each provided with a total of two heating plate guide pins 112 (one (for example, heating plate guide pin 112-3) at the same side as that of the aforementioned heating plate 103 but at a different position and the other one (for example, heating plate guide pin 112-4) at a side opposing the aforementioned side diagonally to the heating plate guide pin 112-3). As described above, the heating plate guide pins 112 are provided at positions symmetrical to each other with respect to a center of the heating plate 103 (barycentric position), and at the adjacent heating plates 103 (heating plates 103 above and below the aforementioned heating plate 103), the heating plate guide pins 112 are provided at positions different from those of the aforementioned heating plate 103 symmetrically to each other. Therefore, even in a case where a plurality of heating plates 103 are provided, pressing can be performed with good balance without causing dislocation. However, the heating plate guide pins 112 are provided for preventing the horizontal dislocation of the heating plate 103, and thus the heating plate 103 is only required to be fixed at least two sections and the two may be provided not diagonally to each other but in parallel to each other.

Figure 4:
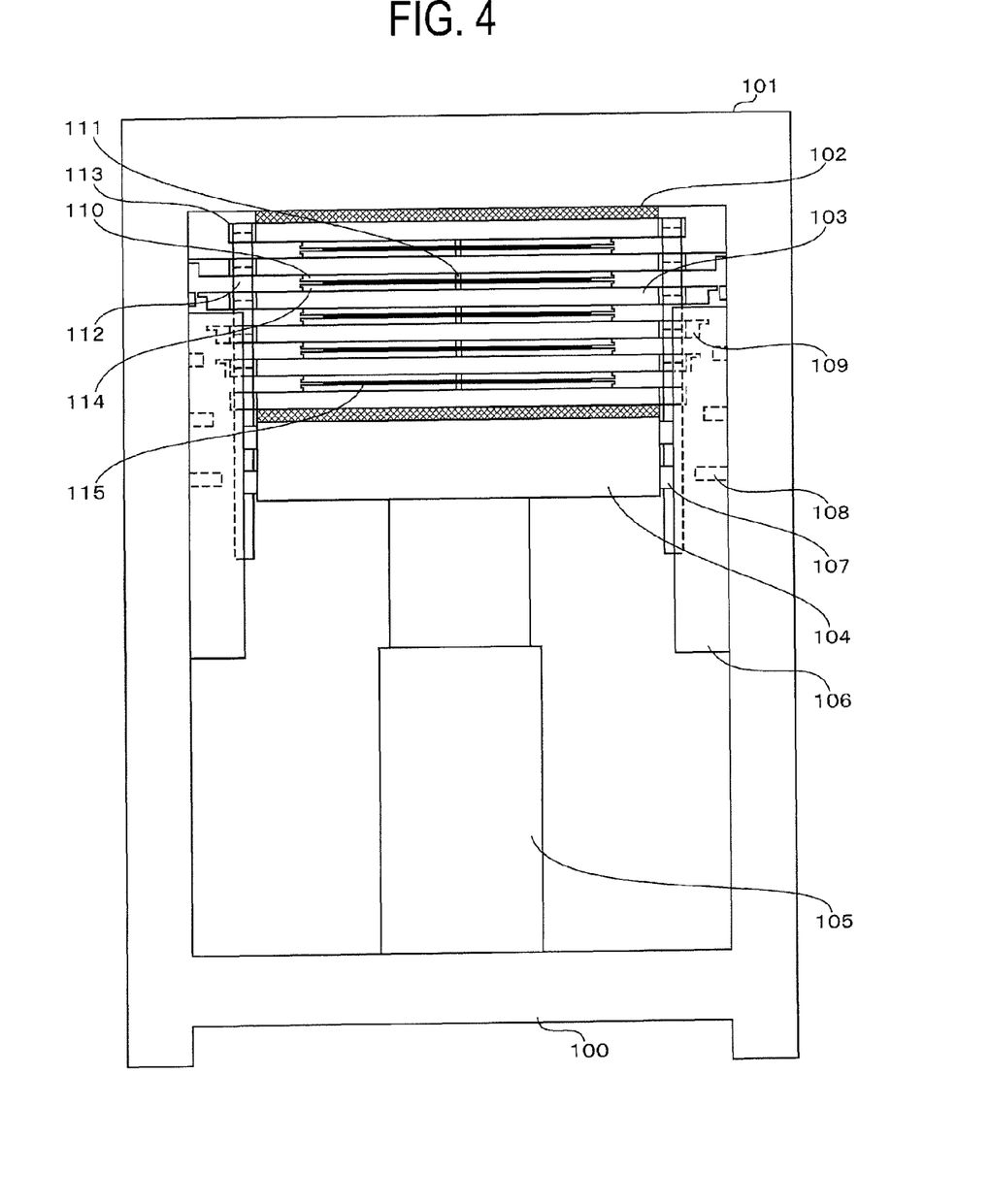
FIG. 4 is a diagram showing how the hot press device shown in FIG. 1 is pressed.

FIG. 4 is an elevation view of a state in which the heating plates 103 has been completely pressed up by the surface plate 104. As shown in FIG. 4, for a laminated body (hereinafter simply referred to as work 115) of the multilayered printed board according to this embodiment, inner layers forming the work 115 are laminated in layer formation order (details is not shown) and they are each temporarily fixed by a pin 111 by being sandwiched between the upper jig 110 and the lower jip 114 to be positioned. The heating plate 103 on a side fixed to the main body (frame 101) is coupled to the frame 101 with a heat insulating plate 102 with low heat conductivity in between. On the other hand, the heating plate 103 closest to the surface plate 104 (press work side) is also similarly fixed to a fix side with a heat insulating plate 102 with low heat conductivity in between. The surface plate 104 is required to move upward and downward so as not to be moved to front, back, right and left by unbalanced load at time of pressing, and thus the surface plate 104 is structured to be smoothly moved by upper and lower sliders 107 via slide guides 106 fitted to the frame 101.

Figure 5:
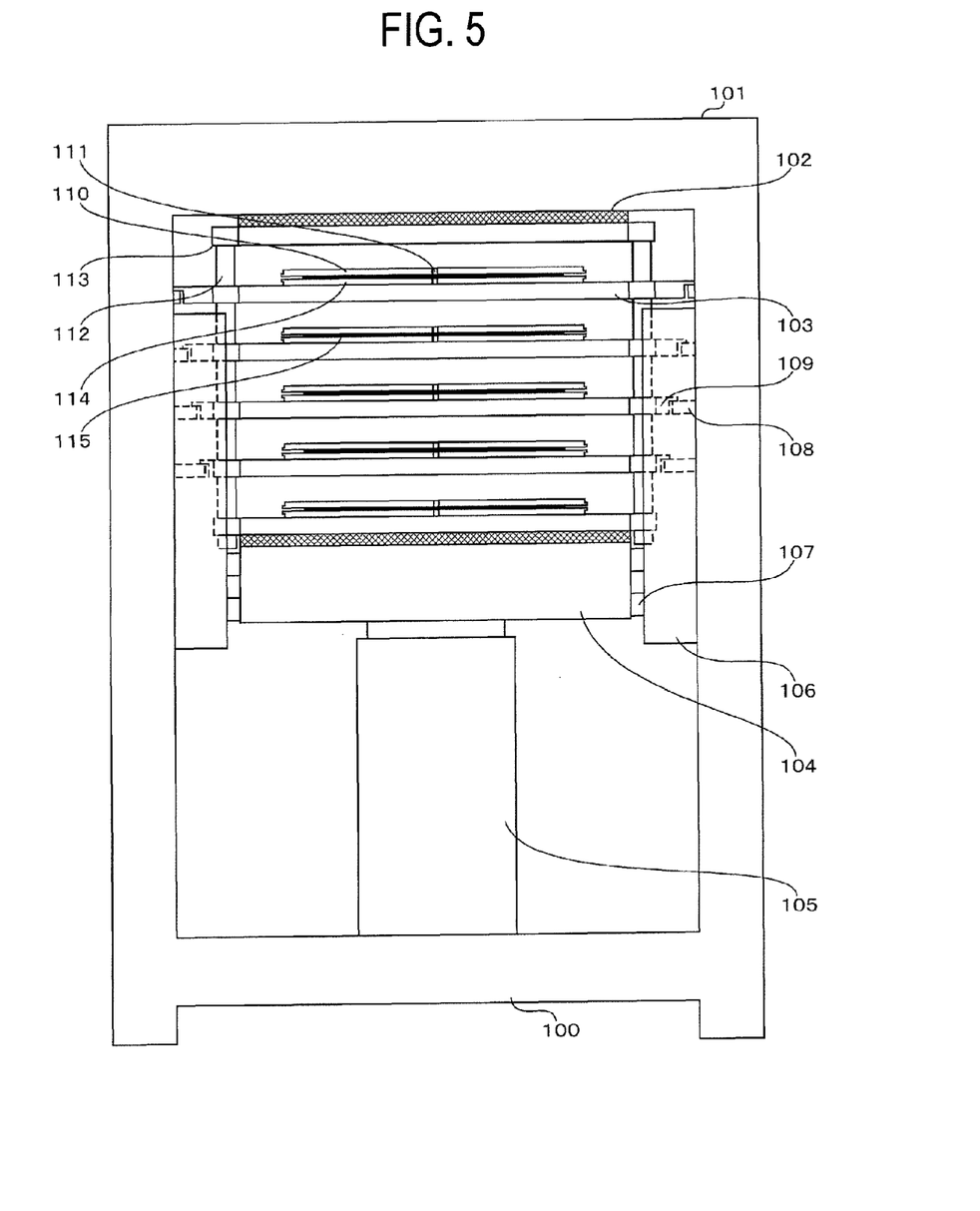
FIG. 5 is a diagram showing a modified example of heating plate guide pins of the hot press device shown in FIG. 1.

Moreover, the middle heating plate 103 includes heat insulating blocks 109 on the right and left and supported at predetermined positions to the frame 101 with blocks 108 in between (in a case where the amount of heat dissipation caused by heat transfer from the heating plate 103 is small, no specification is provided for a material of the heat insulating block 109). The heating plate 103 supplies a temperature-adjustable heat source to thermally cure the work 115 (details is not shown) to thereby program-control temperature and heating time. For applied pressure, the pressure cylinder 105 is moved up by a well-known means (composed of a hydraulic cylinder, a flow control valve, a hydraulic pump, etc. details of which are not shown), and pressure application time and the applied pressure are program-controlled while detecting pressure. The hot press device 100, when inside of the press is formed into a chamber, can sweep air in the chamber by a well-known means (vacuum pump or the like, details of which are not shown) to thereby perform resin curing under reduced pressure. With the structure of a heating plate guide according to this embodiment, the opposing heating plates are positioned with the heating plate guide pins 112 and the steam guide pushes 113 engaging therewith, but for example, as shown in FIG. 5, the heating plates may be skewered with the heating plate guide pins 112 in a shared manner. In this case, design should be such that no temperature variation occurs among the heating plates.

Figure 6:
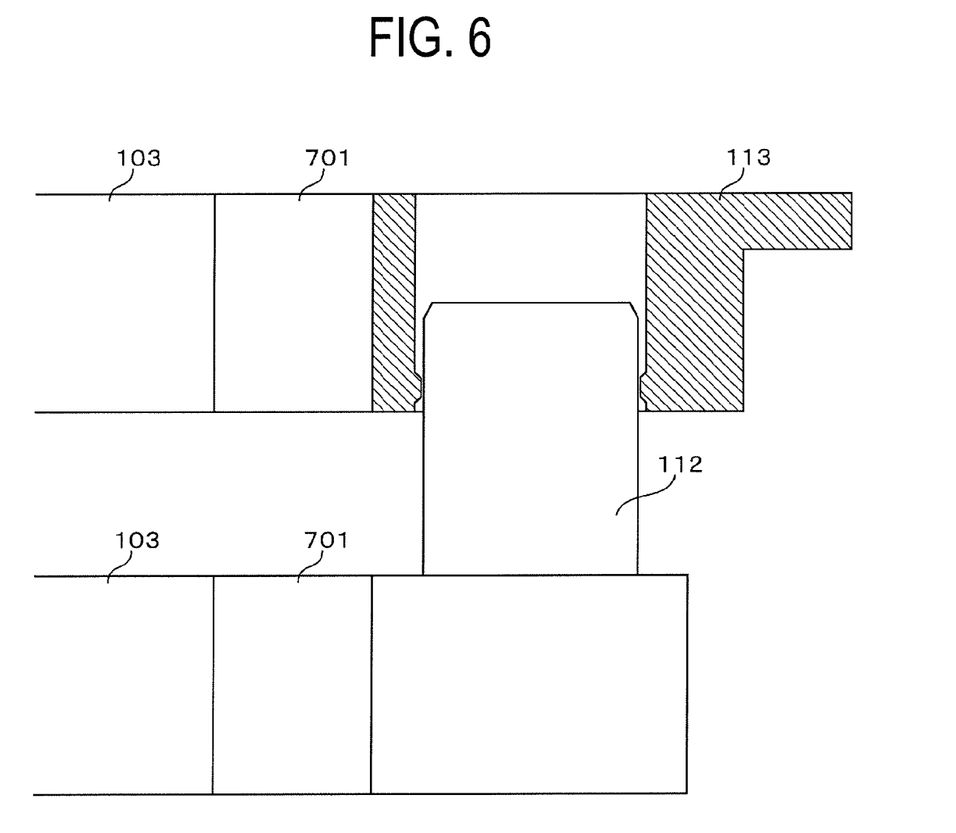
FIG. 6 is a detailed diagram of a guide part of the hot press device shown in FIG. 1.
Figure 7:
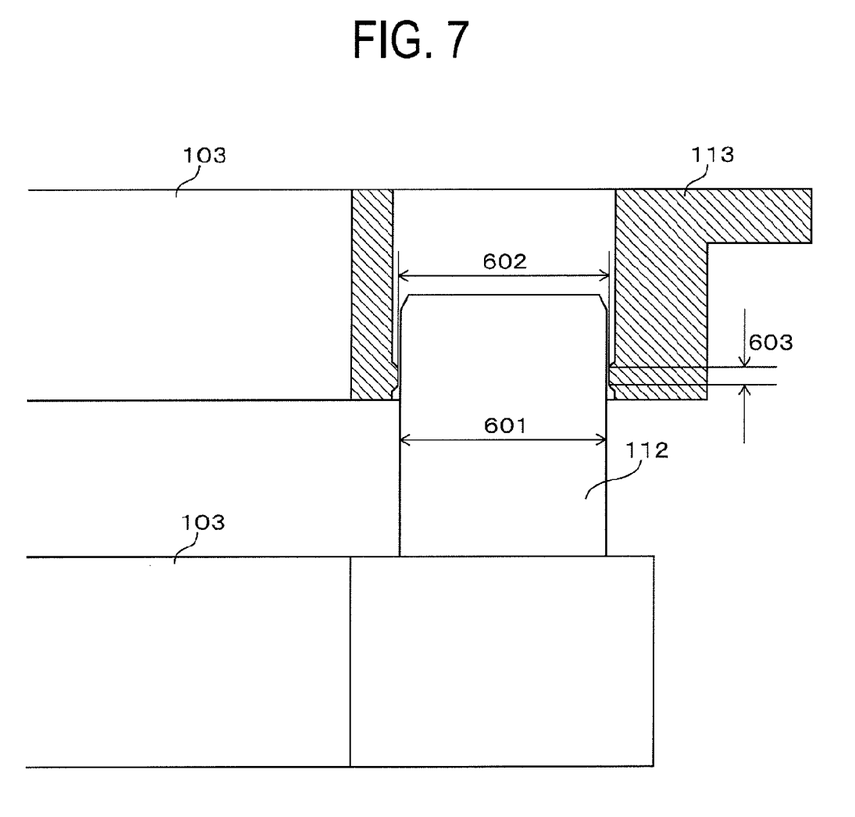
FIG. 7 is a diagram showing a modified example of the guide part shown in FIG. 6.

For the hot press device 100 according to this embodiment, it is important to uniformize temperature distribution of the heating plates 103 in a process of resin-curing the work 115. All the heating plates in the device desirably have the same symmetrical shape and the same weight in order to have most similar possible heat capacity and heat dissipation area. In this embodiment, a weight of a guide component is equal to or smaller than a fiftieth of the weight of the heating plate 103, and a surface area of a heat dissipation portion is also equal to or smaller than a fiftieth of that of the heating plate 103. Further, as shown in FIG. 6, a coupling member 701 (member having a fifth of heat conductively of the heating plate 103) may be provided for a portion coupling the heating plate 103 and the heating plate guide pin 112 or the heating plate guide bush 113. What is important is that a guide member is coupled to the heating plates 103 and that the heat capacity and the heat dissipation areas of the heating plates are matched to form a target shape.

Next, a detailed structure of a heating plate guide according to this embodiment will be described. The heating plate guide according to this embodiment, as shown in FIG. 6, is composed of the heating plate guide bush 113 fixed to the heating plate 103 and the heating plate guide pin 112 which opposes the heating plate guide bush 113 and is fixed to the heating plate 103, and it is composed of a total of two (two pairs) (one for reference and the other one for positioning in a rotation direction). The number of pairs may be two or more, but two pairs are enough since the temperature variation among the heating plates needs to be suppressed to prevent guide damage and gall of a guide part and also in view of component accuracy, component costs, and fitting man-hours.

Moreover, for the detailed structure of the heating plate guide in this embodiment, in order to smoothly move the heating plate guide pin 112 and the heating plate guide bush 113 upward and downward, clearance (gap) between the heating plate guide pin 112 and the steam guide bushes 113 and optimum shapes have been studied. For a clearance (gap) between the heating plate guide pin 112 and the heating plate guide bush 113, assuming required accuracy and a case where the heating plate has inclined to a maximum possible value, inclination of the heating plate guide pin 112 is obtained and a guide bush diameter 602 is determined. Moreover, a portion where the clearance between the heating plate guide pin 112 and the heating plate guide bush 113 is smallest (portion with good accuracy) is preferred to be step-structured so as to provide a smallest possible area (guide height 603). Further, a front surface of a guide portion may be subjected to, for example, induction hardening to improve hardness to thereby prevent a flaw caused by shock.

Figure 8:
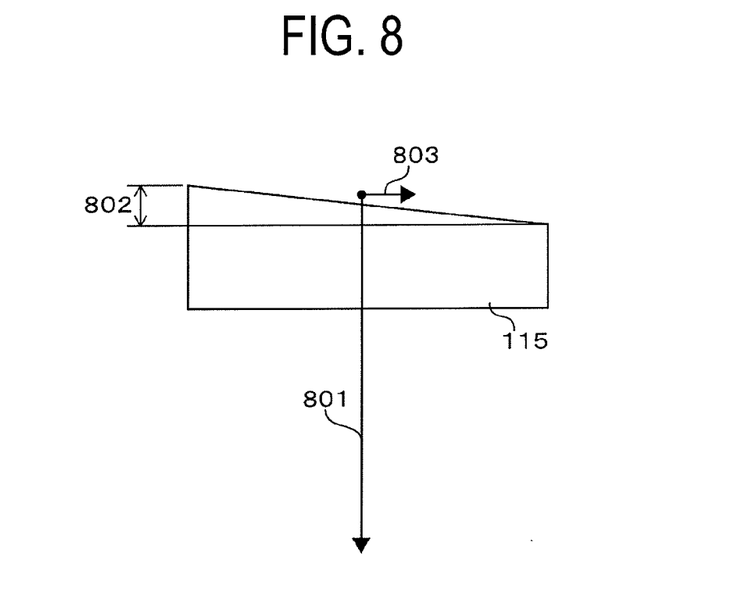
FIG. 8 is a model diagram showing an example of relationship between a diameter of a heating plate guide pin and distortion.
Figure 9:
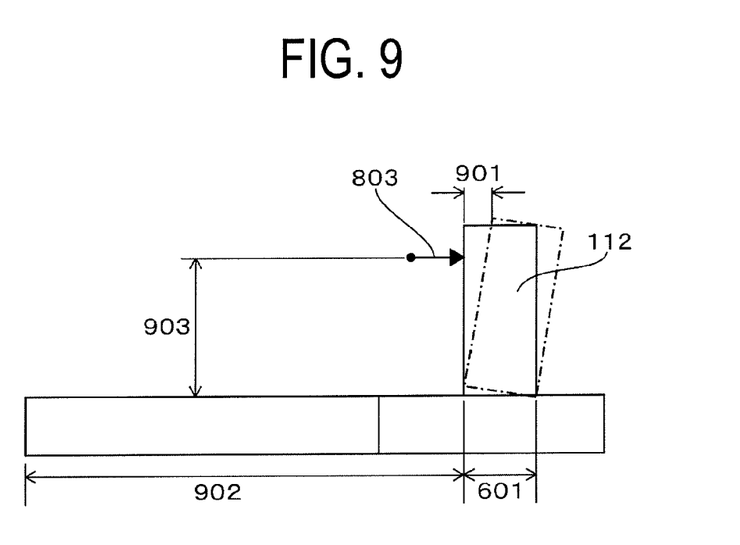
FIG. 9 is a diagram showing how the distortion occurs in the model shown in FIG. 8.
Figure 10:
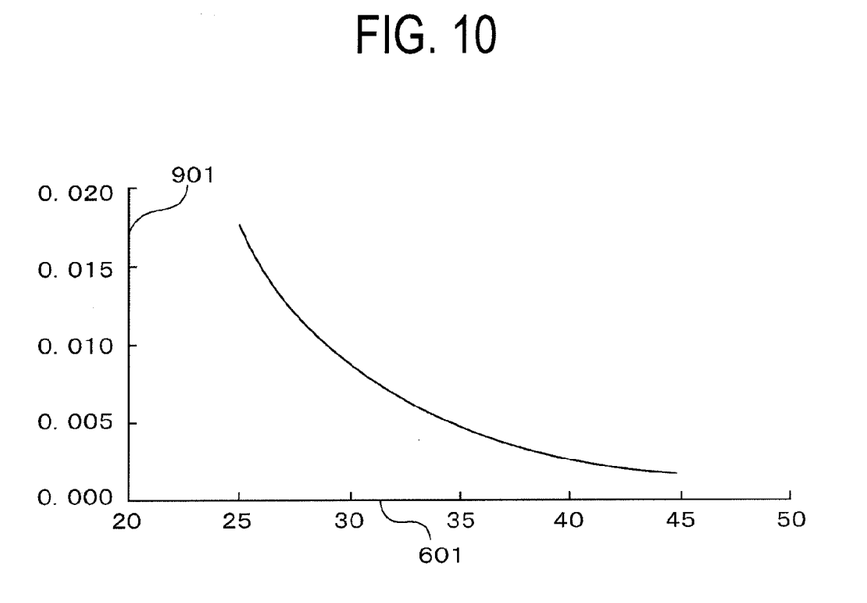
FIG. 10 is a scatter diagram showing an example of the relationship between the diameter of the heating plate guide pin and the distortion.

For, a diameter 601 of the heating plate guide pin 112, a simple model as shown in FIG. 8 is studied. Assuming a horizontal component 803 of press load 801 caused by sheet thickness deviation 802 of the product (work 115), based on physical property (Young's modulus) of the heating plate guide pin 112, geometrical moment of inertia provided by a sectional shape of the heating plate guide pin 112, and a point of action of the horizontal component, a degree of distortion is calculated from a distance of a heating plate guide pin 112 support part and a permitted diameter in view of accuracy and strength is determined. For example, a simple example as shown in FIG. 9 is assumed. Calculating inclination of the heating plate 103 with a 200 TON press, where the sheet thickness deviation 802 is 0.7 mm and a distance 902 from the center of the heating plate is 500 mm, a distance 903 from the guide pin support part to the point of action is 35 mm and the heating plate guide pin 112 is a round bar and its material is steel. Relationship between a degree of distortion 901 and the diameter 601 of the heating plate guide pin 112 is, for example, relationship as shown in FIG. 10. Through such procedures, the diameter 601 of the heating plate guide pin 112 is selected.

As described above, as a result of forming the multilayered printed board through resin hardening by use of the hot press device 100 according to this embodiment, no relative dislocation of the opposing heating plates occurs due to the presence of the guide structure. This consequently makes it possible to suppress dislocation of the inner layer members of the multilayered printed board.

More specifically, reliably guiding and positioning the opposing heating plates can reduce the dislocation of the inner layer forming materials at time of heating a multilayered print wiring substrate and pressure-molding. Moreover, since all the guide members are fitted to the heating plates at the same temperature stage, there is little influence of a heat expansion difference caused by a temperature difference at a guide fitting part, not preventing upward and downward sliding. Further, since the dislocation of the heating plates are suppressed by the guides, the number of positioning guides between the inner layers in the laminated body can be minimized, which can therefore achieve efficient pre-processing of the work (guide hole punching), guide planning of, for example, guide pin standing, and post processing such as guide pin removing, making it possible to improve productivity.

Figure 11:
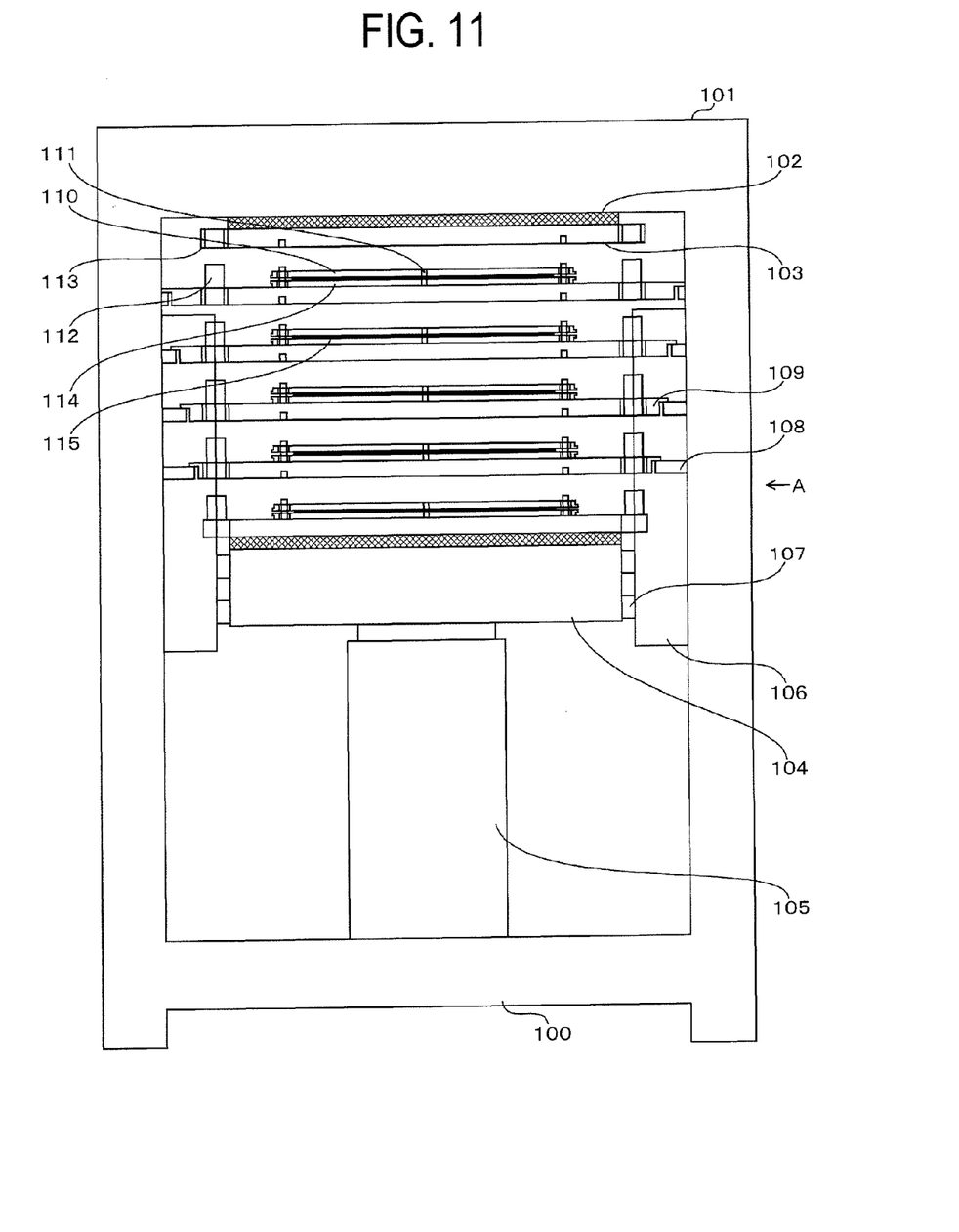
FIG. 11 is a diagram showing a modified example of the hot press device shown in FIG. 1.

In the embodiment described above, the heating plate 103 itself is provided with the heating plate guide pins 112 and the heating plate guide bushes 113, but since it is important not to cause dislocation of the inner layers forming the work 115, as shown in FIG. 11, instead of (or together with) providing the heating plate 103 itself with the heating plate guide pins 112 and the heating plate guide bushes 113, a guide pin and a guide bush can be provided to the upper jig 110 or the lower jip 114. In this case, dislocation of the upper jig 110 or the lower jip 114 does not occur, which therefore permits pressing with higher accuracy.

What is claimed is:

1. A hot press device manufacturing a multilayered printed board by pressing processed members laminated by mutually opposing heating plates, the hot press device comprising:
    a plurality of heating plates capable of moving in a direction in which the processed members are laminated;
    wherein a heating plate guide pin consisting essentially of a projected part and a heating guide bush consisting essentially of a through hole are independently coupled to the sides of each heating plate at a different position,
    a pressure mechanism pressurizing each of the heating plates in the lamination direction,
    wherein the opposing heating plates are positioned with the projected part of the heating plate guide pin and the through hole of the heating plate guide bush engaging therewith, and
    wherein the processed member is arranged between the heating plates and is pressed by the heating plates pressurized by the pressure mechanism while engaged with each other.

2. The hot press device according to claim 1, comprising at least three of the heating plates,
    wherein the processed members are respectively arranged between the heating plates and are respectively pressed by the heating plates pressurized by the pressure mechanism while engaged with each other.

3. The hot press device according to claim 1,
    wherein two heating plate guide pins are respectively coupled diagonally to opposing sides of the heating plate.

4. The hot press device according to claim 3, wherein the heating plate guide pins are coupled to the opposing sides of adjacent heating plates at different positions that are symmetrical to each other.

* * * * *